United States Patent [19]
Kiyoharu

[11] Patent Number: 4,996,554
[45] Date of Patent: Feb. 26, 1991

[54] PRESSURE DEVELOPING DEVICE
[75] Inventor: Hayakawa Kiyoharu, Ama, Japan
[73] Assignee: Brother Kogyo Kabushiki Kaisha, Nagoya, Japan
[21] Appl. No.: 369,044
[22] Filed: Jun. 20, 1989
[30] Foreign Application Priority Data Jun. 21, 1988 [JP] Japan .............................. 63-82195[U]
Jul. 5, 1988 [JP] Japan .............................. 63-89764[U]

[51] Int. Cl.⁵ .......................................... G03B 27/32
[52] U.S. Cl. ...................................... 355/27; 354/304
[58] Field of Search ................... 355/27, 28, 282, 285, 355/290, 295; 100/158 R, 160, 168, 156; 354/304, 297

[56] References Cited
U.S. PATENT DOCUMENTS

| | | | |
|---|---|---|---|
| 4,079,303 | 3/1978 | Cox | 320/17 |
| 4,331,911 | 5/1982 | Park | 320/17 |
| 4,340,823 | 7/1982 | Miyazawa | 307/66 |
| 4,468,571 | 8/1984 | Heavey et al. | 307/46 X |
| 4,488,057 | 12/1984 | Clarke | 307/46 X |
| 4,645,995 | 2/1987 | Terrell et al. | 320/15 X |
| 4,827,312 | 5/1989 | Ogiwara et al. | 355/27 |
| 4,885,521 | 12/1989 | Crampton | 320/14 |

Primary Examiner—L. T. Hix
Assistant Examiner—Khanh Dang
Attorney, Agent, or Firm—Kane, Dalsimer, Sullivan, Kurucz, Levy, Eisele and Richard

[57] ABSTRACT

Disclosed is a pressure developing device having a pair of pressure rollers for pressurizing a photo and pressure sensitive recording sheet and a developing sheet in an overlapped state, the device comprising a plurality of spring members for supplying a variable push force to the pair of pressure rollers and control means for controlling the means for supplying a push force so as to pressurize the central portion of the recording sheet and the developing sheet greater than the side portion. Thus, the photo and pressure sensitive sheet and/or the developing sheet is prevented from being wrinkled.

2 Claims, 3 Drawing Sheets

PRESSURE DEVELOPING DEVICE

BACKGROUND OF THE INVENTION

This invention relates to a pressure developing device suitably used for generating a visible image on a developing sheet by pressurizing a photo and pressure sensitive recording sheet on which a latent limage is formed by exposure and the developing sheet in a state that both the sheets are overlapped.

A transfer type image recording medium is disclosed as already known, for example, in Japanese Patent Provisional Publication SHO58-88739, U.S. Pat. No. 4,399,209 and the like. This transfer type image recording medium is composed of a photo and pressure sensitive recording sheet coated with a plurality of microcapsules containing dye precursor, photosensitive resin, photo polymerization initiator and the like and a developing sheet coated with a developing agent to cause a color developing reaction with the dye precursor.

With the image recording medium, the photo and pressure sensitive recording sheet is exposed based on image data supplied from an original, the developing sheet is overlapped on the exposed surface of this photo and pressure sensitive recording sheet and both the sheets are pressurized, whereby the microcapsules remaining unhardened on the photo and pressure sensitive recording sheet are crushed to enable the dye precursor contained therein to cause the color developing reaction with the developing sheet so that a visible image is generated on the developing sheet. This pressure developing, however, requires large pressure force for crushing the microcapsules.

Thus, a pressure developing device for this kind of the image recording medium employs a pair of backup members (usually each composed of a plurality of backup rollers) are brought into contact with a pair of pressure rollers respectively disposed behind them.

When, however, the backup member brought into pressure contact with the pressure roller on the side of the developing sheet has less rigidity smaller smaller than that of the backup member brought into pressure contact with the pressure roller on the side of the photo and pressure sensitive recording sheet, the pressure roller on the side of the developing sheet is greatly bent to cause the developing sheet to be curved to a concave shape and wrinkled and then image quality is deteriorated when the photo and pressure sensitive recording sheet and the developing sheet are passed between the pressure rollers in the overlapped state.

Further, when pressure force is uniformly imposed between the pressure rollers in the axial direction thereof or larger pressure force is imposed on the opposite sides of the pressure rollers, both the pressure rollers are bent to reduce the pressure force at the central portion thereof and then contraction force directed to the center of the axial direction of the pressure rollers is imposed on the developing sheet to cause it to be wrinkled with a result of the deterioration of the image quality when the photo and pressure sensitive recording sheet and the develping sheet are passed between the pressure rollers in the overlapped state.

SUMMARY OF THE INVENTION

It is therefore an object of the invention to provide an improved pressure developing device having a function capable of preventing a developing sheet and/or a photo pressure sensitive recording sheet from being wrinkled when a pressure development is carried out thereby to improve image quality.

For this purpose, according to this invention there is provided a pressure developing device having a pair of pressure rollers being adapted to be brought into and out of contact with each other for pressurizing an exposed recording sheet containing a plurality of photosensitive microcapsules each containing a component to change the rupture strength thereof when exposed to light and a developing sheet coated with a developer material to develop a visible image thereon in an overlapped state, said pressure developing device further comprising:

push force supply means for respectively supplying a push force to each of said pair of pressure rollers; and control means for controlling said push force supply means so as to push said pair of rollers to pressurize the desired central portion of said recording sheet said developing sheet in an overlapped state with a predetermined pressure force stronger than to pressurize the other portion.

DESCRIPTION OF THE ACCOMPANYING DRAWINGS

DESCRIPTION OF THE EMBODIMENTS

Figure 1:
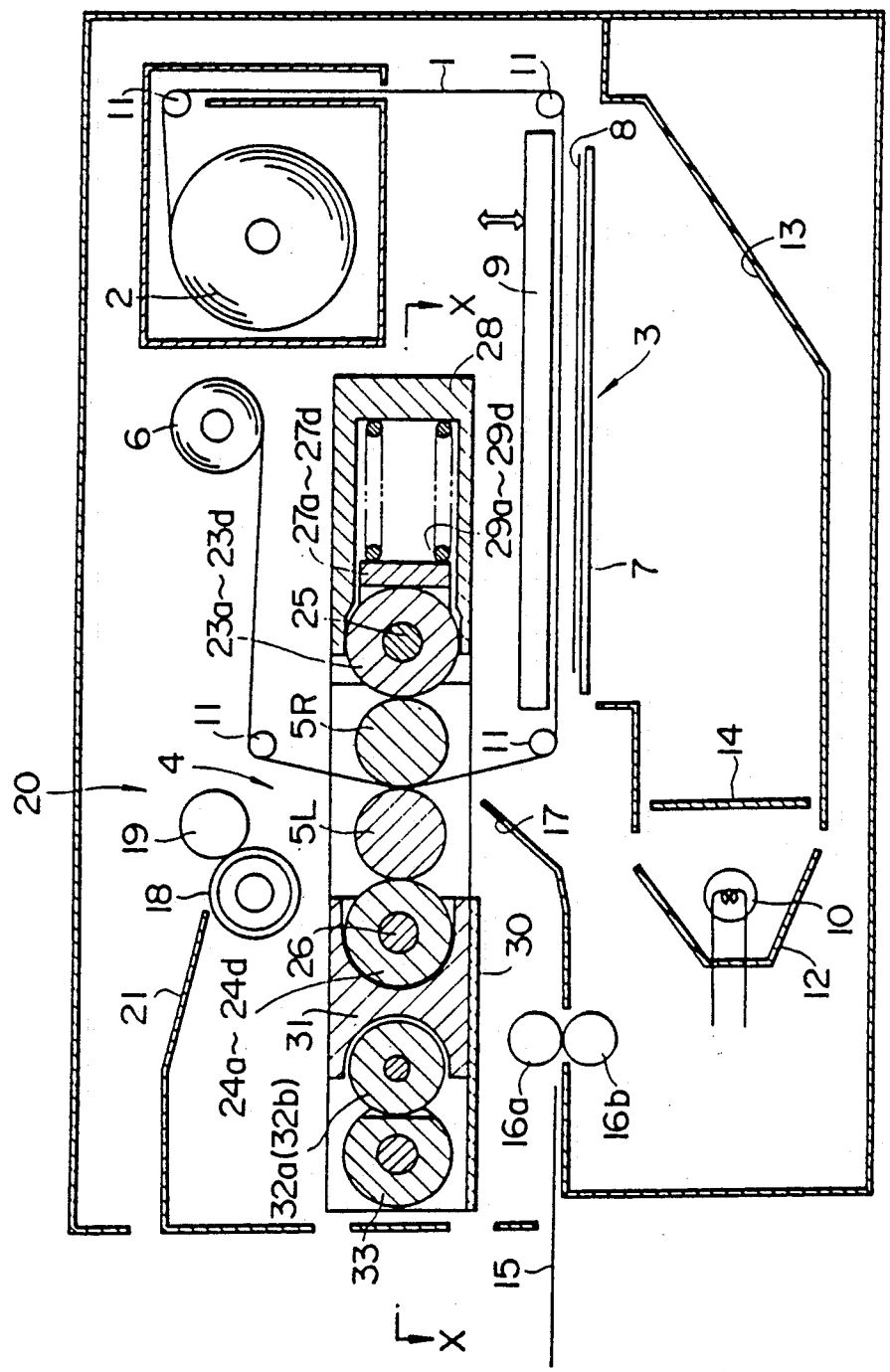
FIG. 1 is a diagram illustraive of an overall schematic arrangement of an image recording apparatus for embodying a pressure developing device according to the present invention.

FIG. 1 is and illustrative view showing an overall schematic arrangement of an imaging device for embodying a pressure developing device according to the present invention, wherein a photo and pressure sensitive recording sheet 1 in the form of roll unwound from an uncoiler 2 is fed to an exposing unit 3 and wound to a recoiler 6 after it passes between a pair of pressure rollers 5R and 5L of pressure developing device 4. The exposing unit 3 is arranged such that an original 8 is placed on a transparent original tray 7 and the photo and pressure sensitive recording sheet 1 is brought into close contact with the original tray 7 by a pressing plate 9 and exposed by light beams from a light source 10.

In FIG. 1, 11 designates a guide roller for feeding the photo and pressure sensitive recording sheet 1, 12 designates a reflector disposed behind the light source 10, 13 designates a dispersing mirror plate for radiating the light beams from the light source 10 toward the exposing unit 3, and 4 designates a color filter for correcting the color characteristic of an original image.

A developing sheet 15 is fed into the imaging device by feed rollers 16a and 16b and introduced between pressure rollers 5R and 5L of the pressure developing device 4. Therefore, when the photo and pressure sensitive recording sheet 1 subjected to a prescribed exposing treatment is fed between the pressure roller 5R and 5L together with developing sheet 15 overlapped therewith, a visible image is generated on the developing sheet 15, as described above. After passing through the pressure developing device 4, the developing sheet 15 is passed through a thermal fixing unit 20 composed of a heat roller 18 and a rubber roller 19 to be subjected to a fixing and luster treatment for making the colors thereof clearer, and them discharged externally of the imaging device through a guide plate 21.

Figure 2:
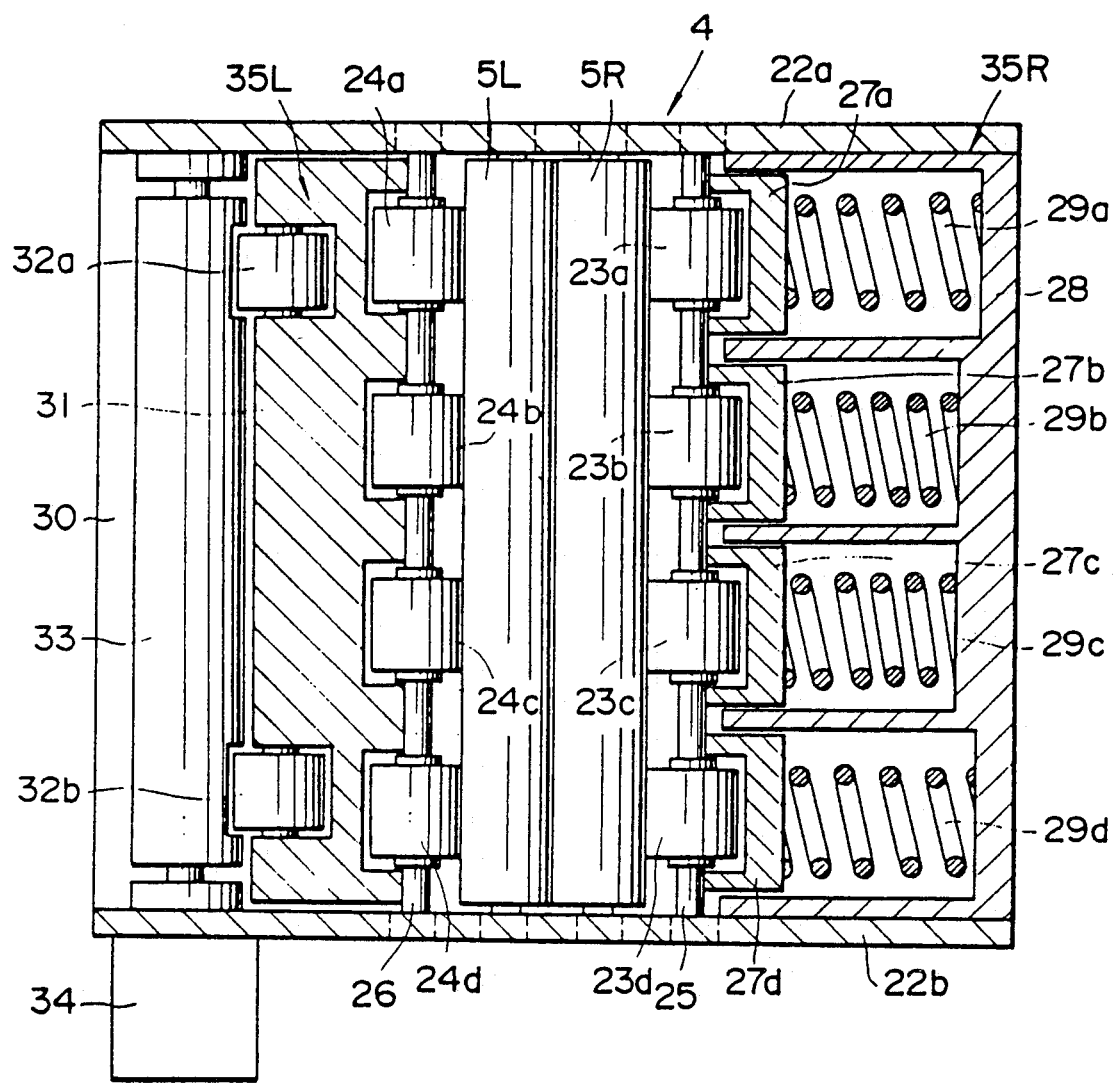
FIG. 2 is a first embodiment of a pressure developing device according to the present invention taken along line X—X of FIG. 1.

FIG. 2 is a first embodiment of the pressure developing device 4 comprising supporting frames 22a, 22b, a pair of the pressure rollers 5R and 5L disposed between the frames 22a and 22b in such a manner that they can adapted to be brought into and out of contact with each other, and a group of backup rollers 23a–23d and a group of backup rollers 24a–24d respectively disposed behind the pressure rollers 5R and 5L in pressure contact therewith. The backup rollers 23a–23d and 24a–24d are disposed in the axial direcion of the pressure rollers 5R and 5L spaced apart from each other at the same intervals, respectively and rotatably received by support shafts 25 and 26 supported by the frames 22a and 22b. The groups of rollers 23a–23d and 24a–24d can be horizontally moved to the right and left directions in FIG. 2 in accordance with the movement of the pressure rollers 5R and 5L. Load receiving members 27a–27d are held in abutment against the support shaft 25 of the backup rollers 23a–23d which are brought into contact with the pressure roller 5R on the side of the photo and pressure sensitive recording sheet 1. These load receiving members 27a–27d are pressured and urged against the support shaft 25 by load springs 29a–29d interposed between the load receiving members 27a–27d and a back block member 28 fixed between the frames 22a and 22b. In addition, a back block member 31 slidingly disposed on a base table 30 is held in abutment against the support roller of the backup rollers 24a–24d which are brought into contact with the pressure roller 5L on the side of the developing sheet 15, and cam rollers 32a and 32b disposed on the rear portion of this back block member 31 is engaged with a cutout rollers 33 rotatably supported between the frames 22a and 22b. A drive motor 34 is coupled with an end of the cutout roller 33. In this embodiment, the backup rollers 23a–23d, the load receiving members 27a–27d, the back block member 28 and the load springs 29a–29d are referred to as a backup member 35R as whole, and the backup rollers 24a–24d and the back block member 31 are referred to as backup member 35L as a whole.

In this pressure developing device arranged as described above, since the cam rollers 32a and 32b are pressed while the cutout roller 33 is rotated once by the drive motor 34 to cause the back block member 31 to press the support shaft 26, the pressure roller 5L on the one side is pressed against the pressure roller 5R on the other side by the group of the backup rollers 24a–24d. The compressing load of the load springs 29b and 29c disposed at the central portion of the support shaft 25 is set in such a manner that these load springs 29b and 29c have a slightly stronger expanding and contracting force than that of the load springs 29a and 29d disposed at the opposite sides of the support shaft 25. More specifically, in this embodiment, the load springs 29b and 29c at the central portion has the expanding and contracting force about 10% stronger than that of the load springs 29a and 29d at the opposite sides. As a result, the pressure roller 5R on the side of the photo and pressure sensitive recording sheet 1 is not almost bent and the pressure force imposed between the pressure rollers 5R and 5L is prevented from being reduced at the central portion in the axial direction thereof, whereby the photo and pressure sensitive recording sheet 1 and the developing sheet 15 are prevented from being wrinkled by contracting forces imposed to them which is directed toward the central portion in the axial direction of the pressure rollers.

Figure 3:
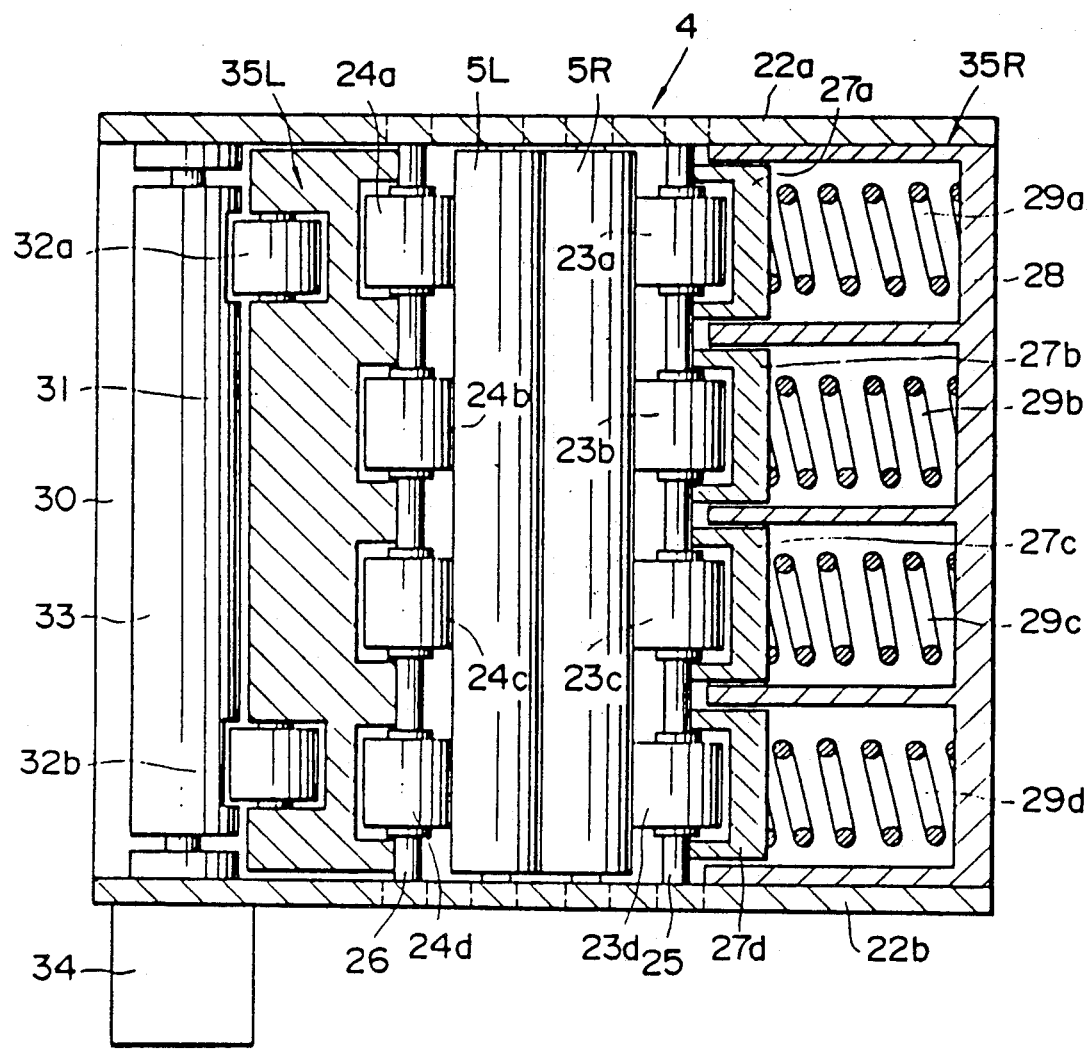
FIG. 3 is a second embodiment of a pressure developing device according to the present invention taken along line X—X of FIG. 1.

FIG. 3 is a second embodiment of a pressure developing device according to the present invention taken along line X—X of FIG. 1, wherein the pressure roller 5R is pressed to the counter direction by the load springs 29a–29d at the time, a prescribed load is imposed between both the pressure rollers 5R and 5L. This embodiment is arranged in such a manner that a developing sheet 15 passes between the pressure rollers 5R and 5L while the prescribed load is imposed therebetween; in this case, the backup member 35L brought into pressure contact with the pressure roller 5L on the side of the developing sheet 15 employs such materials or a structure that it has a slightly larger pressing force than that of the backup member 35R brought into contact with the pressure roller 5R on the side of the photo and pressure sensitive sheet 1. As a result, when the photo and pressure sensitive sheet 1 and the developing sheet 15 are passed between both the pressure rollers 5L and 5R in an overlapped state, the pressure roller 5L on the side of the developing sheet 15 is not almost bent and the pressure roller 5R on the side of the photo and pressure sensitive paper 1 is bent in a degree greater than the pressure roller 5L, whereby the developing sheet 15 is prevented from being wrinkled. The force exerted on the roller 5R is controlled by the resiliency of springs 29a–29d and the position of back block 28.

It should be understood that the present invention in not limited to the above embodiments described in detail, but many changes and modifications may be made therein without departing from the spirit of this invention. For example, not shown load springs similar to the load springs 29a–29d may disposed on the side of the pressure roller 5L, these springs having of course a stronger expanding and contracting force than the springs 29a–29d. In addition, this invention is applicable not only to transfer type exposure but also to a reflection imaging type exposure. Furthermore, the push force of the backup member 35R may be changed from that of the backup member 35L by changing the material and a cross sectional secondary moment of various member, this change can be also achieved by changing a rigidity of the support shafts 25 and 26, the groups of the backup rollers 23a–23d and 24a–24d and the like or changing the diameter of various rollers.

As described above, according to this invention, the developing sheet and/or the photo and pressure sensitive recording sheet is prevented from being wrinkled while a pressure development is carried out, whereby an image of improved quality can be obtained.

What is claimed is:

1. A pressure developing device having a pair of pressure rollers being adapted to be brought into and out of contact with each other for pressurizing an exposed recording sheet containing a plurality of photosensitive microcapsules each containing a component to change the rupture strength thereof when exposed to light and a developing sheet coated with a developer material to develop a visible image thereon in an overlapped state, said pressure developing device further comprising:

a plurality of elastic spring members arranged along one of said pair of rollers from edge to edge for generating a push force, said elastic spring members being arranged in such a manner that the push force of the elastic spring members located at a central portion of said one of said pair of pressure rollers is stronger than that of the elastic spring members located at said edges; and a plurality of backup rollers for respectively transmitting the push force generated by each of said elastic spring members to said one of said pair of rollers.

2. The pressure developing device in accordance with claim 1 further comprising means for compressing said elastic spring members located at said roller central portion more than the elastic spring members located at said roller edges.

* * * * *